(12) United States Patent
Iwaki et al.

(10) Patent No.: US 11,619,666 B1
(45) Date of Patent: Apr. 4, 2023

(54) SOURCE MEASURE APPARATUS INCLUDING FEEDBACK PATH AND MEASUREMENT PATH

(71) Applicant: Keysight Technologies, Inc, Santa Rosa, CA (US)

(72) Inventors: Nobuaki Iwaki, Hachioji (JP); Yasuhiro Miyake, Hachioji (JP); Masaki Sato, Hachioji (JP); Hiroshi Nada, Hachioji (JP)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 17/162,893

(22) Filed: Jan. 29, 2021

(51) Int. Cl.
*G01R 31/28* (2006.01)
*G01R 31/00* (2006.01)
*G01R 31/30* (2006.01)

(52) U.S. Cl.
CPC ....... *G01R 31/2879* (2013.01); *G01R 31/002* (2013.01); *G01R 31/3004* (2013.01)

(58) Field of Classification Search
CPC ................ G01R 31/26; G01R 31/2642; G01R 31/2648; G01R 31/2831; G01R 31/31702
See application file for complete search history.

(56) References Cited

U.S. PATENT DOCUMENTS

| | | | |
|---|---|---|---|
| 5,579,236 A | 11/1996 | Tamamura et al. | |
| 7,903,008 B2 | 3/2011 | Regier | |
| 8,847,674 B1* | 9/2014 | Alley | G05F 3/04 |
| | | | 327/538 |
| 9,207,282 B2 | 12/2015 | Faehnrich | |
| 9,413,174 B2 | 8/2016 | Gostein et al. | |
| 2005/0237079 A1* | 10/2005 | Tanida | G01R 31/2844 |
| | | | 324/762.01 |
| 2021/0382091 A1* | 12/2021 | Petersen | G01R 15/146 |

OTHER PUBLICATIONS

Kohichi Maeda et al., "Intelligent Instrument Streamlines dc Semiconductor Parameter Measurements", Hewlett Packard Journal, Oct. 1982, vol. 33, Nov. 10, pp. 1-32.

* cited by examiner

*Primary Examiner* — Tung X Nguyen

(57) ABSTRACT

A measurement apparatus includes external terminals configured for connection to a device-under-test (DUT), the external terminals including first and second force terminals and first and second sense terminals. The measurement apparatus further includes a controller and a feedback loop configured in a current feedback mode to sense a current flowing from the first force terminal to the second force terminal, and in a voltage feedback mode to sense a voltage across the first and second sense terminals. The measurement apparatus further includes a measurement path configured to measure a least one of a voltage and current across a pair of the external terminals and to supply the measured at least one of the voltage and current to the controller.

27 Claims, 14 Drawing Sheets

SOURCE MEASURE APPARATUS INCLUDING FEEDBACK PATH AND MEASUREMENT PATH

BACKGROUND

A Source Measure Unit (SMU) is a single instrument that is capable of precisely sourcing and measuring current and voltage at the same time. The SMU simplifies measurement setup and increases measurement accuracy when compared to test configurations employing multiple single-function instruments.

FIG. 1 is a circuit diagram showing an example of the Source Measure Unit (SMU) 100 of the related art.

The High and Low Force terminals and High and Low sense terminals shown in FIG. 1 are for establishing 4-wire Kelvin connection to a device-under-test (DUT) (see, e.g., FIGS. 2 and 3 discussed later). In particular, in a voltage mode, the Force terminals may "force" a voltage on the DUT while the Sense terminals measure a voltage across the DUT. In a current mode, the Force terminals may force a current on the DUT while the Sense terminals measure a voltage across the DUT.

The SMU 100 of this example includes a controller 102 such as a digital signal processor. The controller 102 outputs a digital value indicative of a target voltage/current to a digital-to-analog converter (DAC) 104. The corresponding output of the DAC 104 is buffered by a power amplifier 106, and an output of the power amplifier 106 is applied to one end of a range resistance 108, while the other end of the range resistance 108 is coupled to the High Force terminal of the SMU 100.

A voltage across the range resistance 108 is measured by a first amplifier (Amp1) 110, the output of which is converted to a corresponding digital value by a first analog-to-digital converter (ADC1) 124. This digital value corresponding to the voltage across the range resistance 108 is feed back to the controller 102. The controller 102 may determine the current flowing from the High Force terminal to the Low Force terminal (through a DUT, not shown) based on the voltage across the range resistance 108 and the known resistance value of the range resistance 108. The SMU 100 is capable of functioning as a current/voltage source by adjusting the output of the DAC 104 to maintain a given voltage or to sweep a range of voltages across the range resistance 108.

The SMU 100 of FIG. 1 further includes a second amplifier 122 which amplifies a voltage across the High and Low Sense terminals. The amplified output of the second amplifier (Amp2) 122 is applied as the input of a second analog-to-digital converter (ADC2) 126, and a corresponding digital value output by the second ADC 126 is applied to the controller 102. In this manner, the SMU 100 operates as voltmeter which measures a voltage across the DUT.

Still referring to FIG. 1, the capacitor 112 and the resistors 114, 116, 118 and 120 may be provided to filter transient voltages and/or protect internal circuitry of the SMU 100. However, the presence of the capacitor 112 prevents the SMU 100 from accurately measuring high frequency transient voltages across a DUT. Further, the inductance component of a cable connected between the High Force terminal and the DUT can cause discrepancies in the observed timing of a high-speed current pulse applied to the DUT with respect to the transient response of the current. This creates a discrepancy between an actual voltage value and a voltage value observed in the DUT. As a result, in order to accurately measure the behavior of the voltage value across a broad spectrum of test conditions, the test setup including the SMU 100 may be supplemented with additional instruments such an oscilloscope. This is represented in FIG. 2 which illustrates a 4-wire Kelvin connection of the SMU 100 to a DUT 900. As shown, an external instrument 800 is provided to measure, for example, transients not readily measured by the SMU 100. In addition to the drawback of requiring the provision of the external instrument 800, it can be both difficult and time consuming to synchronize the measurement results of the SMU 100 and external instrument 800.

Another limitation of the SMU 100 arises when it is used as a power source for the DUT and a bypass capacitor is connected to the DUT to prevent noise from entering the DUT. An example of this is illustrated in FIG. 3 which shows a bypass capacitor and shunt resister at the input of the DUT 900. Any sudden increase in current consumed by the DUT can not be precisely monitored by the SMU 100 due to current drawn from the bypass capacitor. As such, in order to accurately monitor sudden variations in current consumed by the DUT, an external instrument 800 is used as to measure the voltage across a shunt resistor. As with FIG. 2, this has the disadvantage of requiring the provisioning and hook-up of the external instrument 800, and synchronizing the external instrument 800 with the SMU 100 can be problematic.

SUMMARY

According to an aspect of the inventive concepts, a measurement apparatus is provided which includes external terminals configured for connection to a device-under-test (DUT), the external terminals including first and second force terminals and first and second sense terminals. The measurement apparatus further includes a controller and a feedback loop configured in a current feedback mode to sense a current flowing from the first force terminal to the second force terminal, and in a voltage feedback mode to sense a voltage across the first and second sense terminals. The measurement apparatus further includes a measurement path configured to measure a least one of a voltage and current across a pair of the external terminals and to supply the measured at least one of the voltage and current to the controller.

According to another aspect of the inventive concepts, a measurement apparatus is provided which includes first and second force terminals, first and second sense terminals, a controller configured to output a first digital signal corresponding to a first current value, a digital-to-analog converter configured to convert the first digital signal to a first analog signal, a power amplifier configured to amplify the first analog signal, a range resistor connected in series between an output of the power amplifier and the first force terminal, a first amplifier configured to amplify a voltage across the range resistor, and a first analog-to-digital converter (ADC) configured to convert an output of the first amplifier to a second digital signal, and apply the second digital signal to the controller. The measurement apparatus further includes a first resistor connected across the first force terminal and the first sense terminal, a second resistor having a first end connected to the first sense terminal, a first capacitor connected across the first force terminal and a second end of the second resistor, a second amplifier configured to amplify a voltage across the second end of the second resistor and the second sense terminal, a third amplifier configured to amplify a voltage across the first sense terminal and the second sense terminal, and at least one second ADC configured to convert outputs of the second and third amplifiers to respective second and third digital signals, and to apply the second and third digital signals to the controller.

According to still another aspect of the inventive concepts, a measurement apparatus is provided which includes first and second force terminals, first and second sense terminals, an input terminal, a controller configured to output a first digital signal corresponding to a first current value, a digital-to-analog converter configured to convert the first digital signal to a first analog signal, a power amplifier configured to amplify the first analog signal, a range resistor connected in series between an output of the power amplifier and the first force terminal, a first amplifier configured to amplify a voltage across the first resistor, a first analog-to-digital converter (ADC) configured to convert an output of the first amplifier to a second digital signal, and apply the second digital signal to the controller. The measurement apparatus further includes a first resistor connected across the first force terminal and the first sense terminal, a second resistor having a first end connected to the first sense terminal, a first capacitor connected across the first force terminal and a second end of the second resistor, a second amplifier configured to amplify a voltage across the second end of the second resistor and the second sense terminal, a third amplifier configured to amplify a voltage across the first sense terminal and the input terminal, and at least one second ADC configured to converts outputs of the second and third amplifiers to respective third and fourth digital signals, and to apply the third and fourth digital signals to the controller.

According to another aspect of the inventive concepts, a measurement apparatus is provided which includes first and second force terminals, first and second sense terminals, a remote voltage input terminal, a controller configured to output a first digital signal corresponding to a first current value, a digital-to-analog converter configured to convert the first digital signal to a first analog signal, a power amplifier configured to amplify the first analog signal, a range resistor connected in series between an output of the power amplifier and the first force terminal, a first amplifier configured to amplify a voltage across the first resistor, and a first analog to digital converter configured to convert an output of the first amplifier to a second digital signal, and apply the second digital signal to the controller. The measurement apparatus further includes a first resistor connected across the first force terminal and the first sense terminal, a second resistor having a first end connected to the first sense terminal, a first capacitor connected across the first force terminal and a second end of the second resistor, a second capacitor having a first end connected to the remote voltage input terminal, a second amplifier configured to amplify a voltage across the second end of the second resistor and the second sense terminal, a third amplifier configured to amplify a voltage across a second end of the second capacitor and the first sense terminal, and at least one second ADC configured to converts outputs of the second and third amplifiers to respective third and fourth digital signals, and to apply the third and fourth digital signals to the controller.

According to yet another aspect of the inventive concepts a measurement apparatus is provided which includes first and second force terminals, first and second sense terminals, a remote voltage input terminal, a controller configured to output a first digital signal corresponding to a first current value, a digital-to-analog converter configured to convert the first digital signal to a first analog signal, a power amplifier configured to amplify the first analog signal, a range resistor connected in series between an output of the power amplifier and the first force terminal, a first amplifier configured to amplify a voltage across the first resistor, a first analog-to-digital converter (ADC) configured to convert an output of the first amplifier to a second digital signal, and apply the second digital signal to the controller. The measurement apparatus further includes a first resistor connected across the first force terminal and the first sense terminal, a second resistor having a first end connected to the first sense terminal, a second amplifier configured to amplify a voltage across the first force terminal and the second sense terminal, a third amplifier configured to amplify a voltage across a second end of the second resistor and the second sense terminal, and at least one second ADC configured to converts outputs of the second and third amplifiers to respective second and third digital signals, and to apply the second and third digital signals to the controller.

BRIEF DESCRIPTION OF THE DRAWINGS

The above and other aspects and features of the inventive concepts will become readily apparent from the detailed description that follows, with reference to the accompanying drawings, in which.

DETAILED DESCRIPTION

Figure 1:
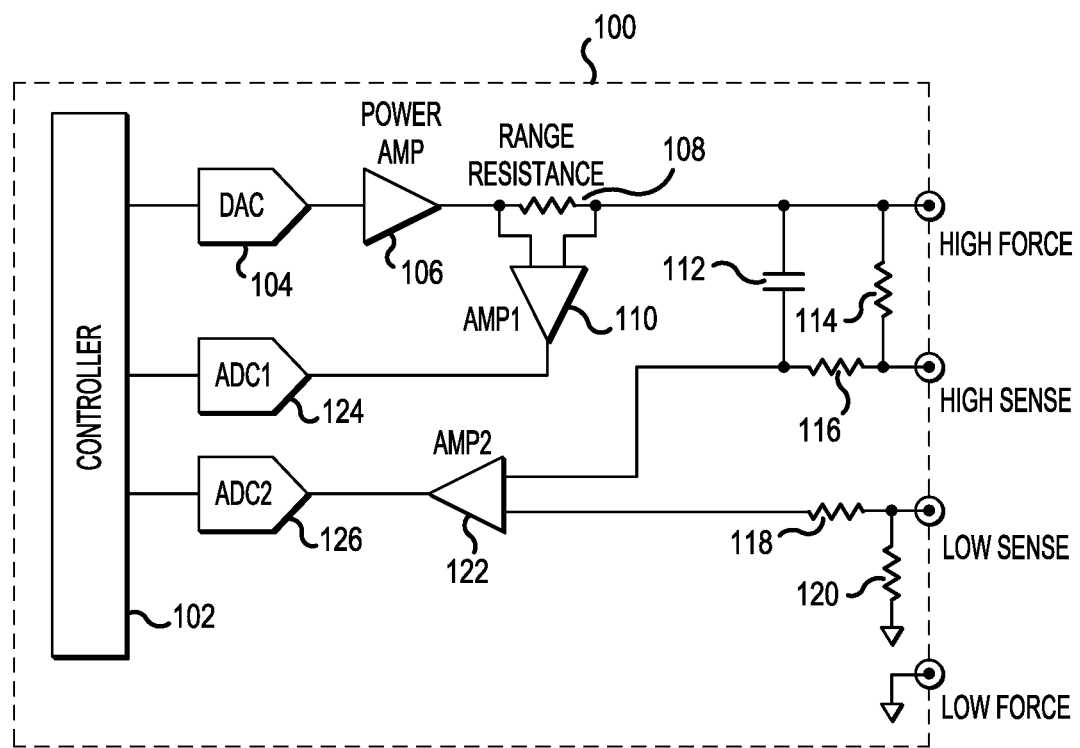
FIG. 1 is a circuit diagram of a source measure unit (SMU) of the related art.
Figure 2:
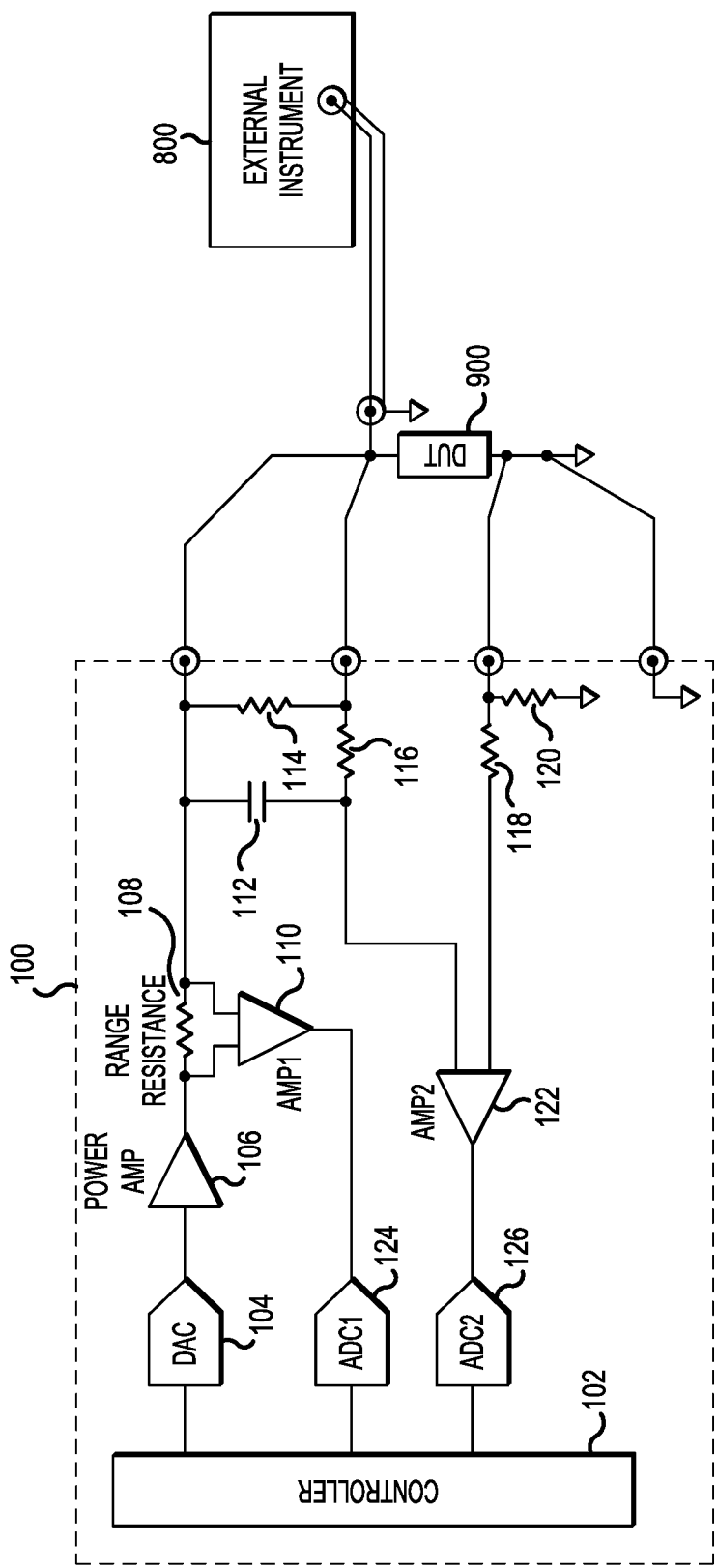
FIGS. 2 and 3 are circuit diagrams of the SMU of FIG. 1 and an external instrument connected to a device-under-test (DUT)
Figure 3:
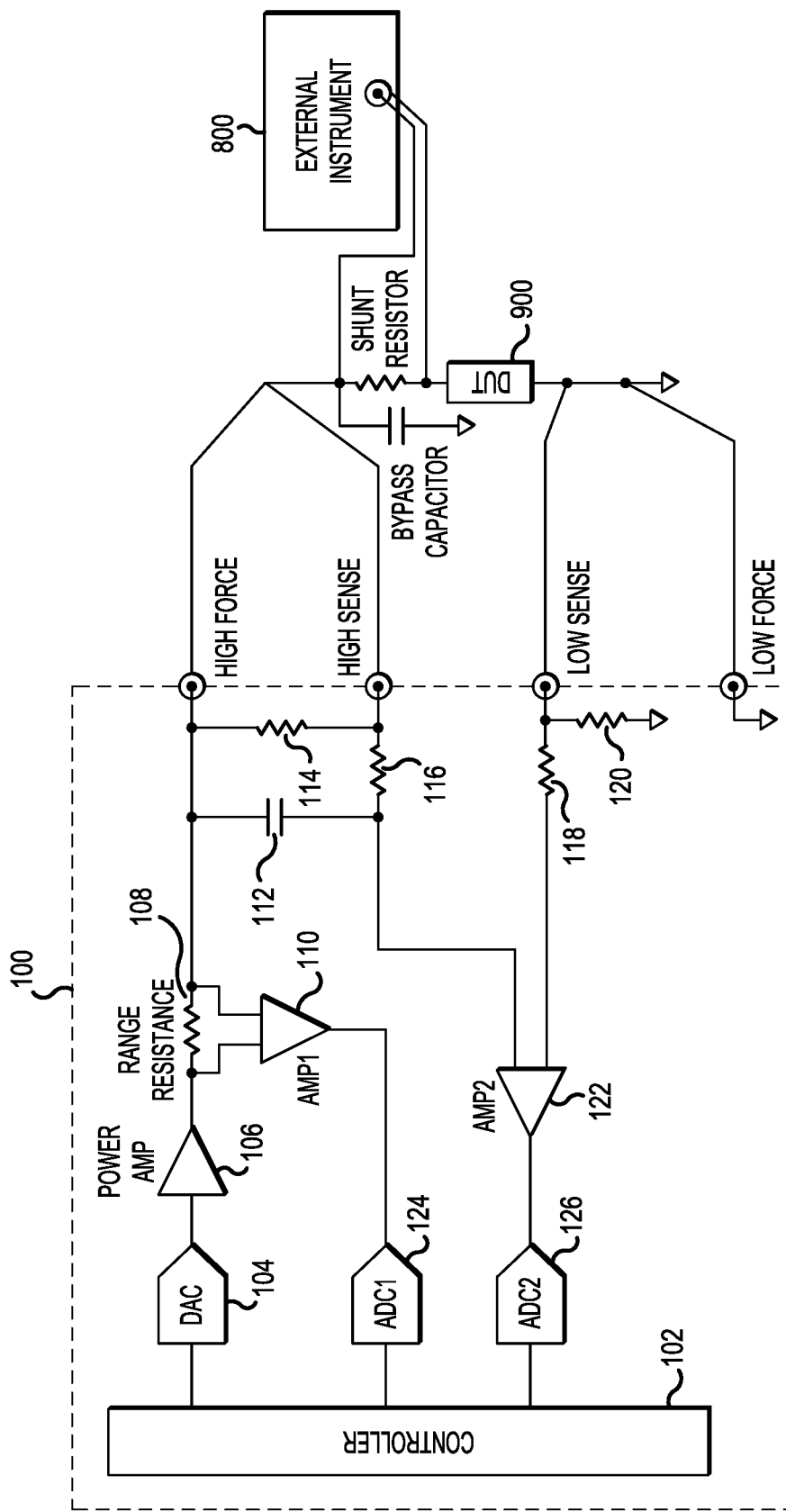

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a", "an" and "the" are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to", "coupled to", or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

Throughout the drawings, like reference numbers refer to the same or similar components. It will be understood that while individual circuit elements are shown and described (e.g., "resistor", "capacitor", "amplifier" and so on), these elements can be implemented with multiple circuit components (e.g., multiple circuit components may together form a "resistor", a "capacitor," an "amplifier" and so on).

Figure 4:
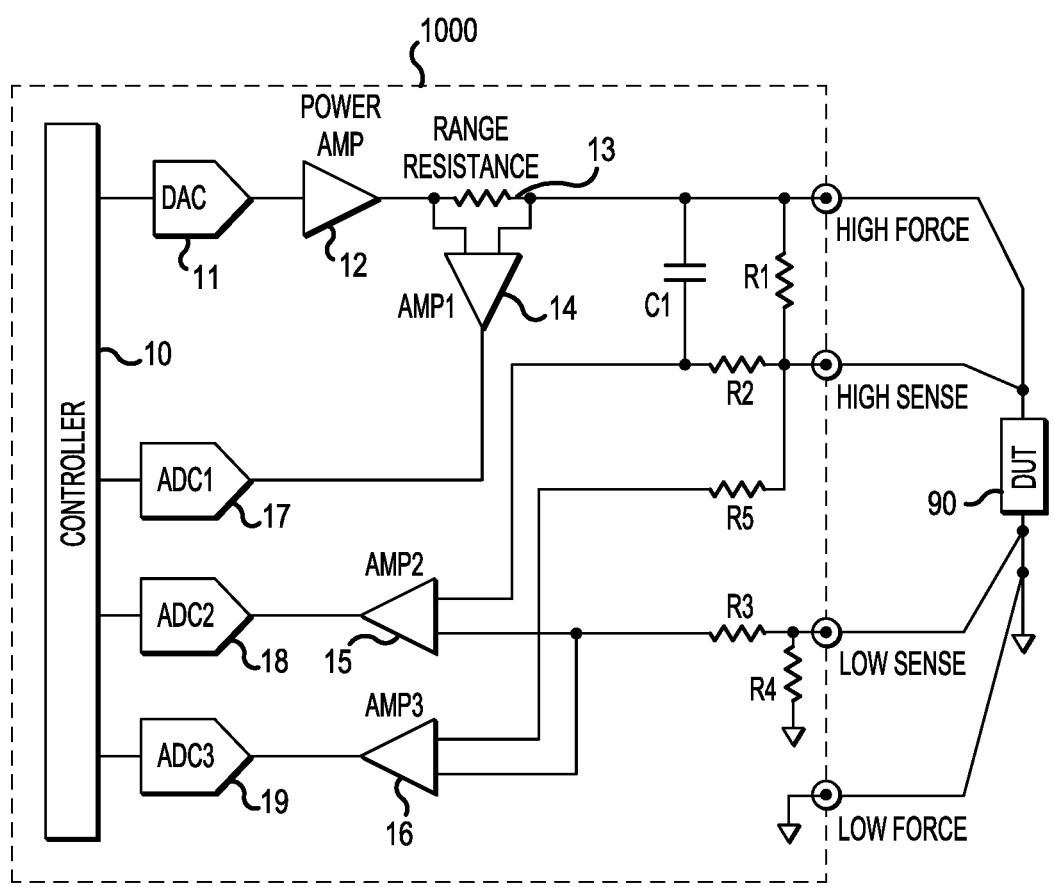
FIG. 4 is a circuit diagram of a measurement apparatus and DUT according to an embodiment of the inventive concepts.

FIG. 4 is a circuit diagram of a measurement apparatus 1000 according to an embodiment of the inventive concepts. The measurement apparatus 1000 may be a power supply with measurement functionality, an example of which is a source measure unit (SMU).

Referring to FIG. 4, the measurement apparatus 1000 of this example includes a controller 10, a digital-to-analog convertor (DAC) 11, a power amplifier 12, a range resistance 13, first through third amplifiers 14~16, a capacitor C1, first through fifth resistors R1~R5, and first through third analog-to-digital converters (ADCs) 17~19. In addition, the measurement apparatus 1000 includes first and second force terminals designated as High Force and Low Force in FIG. 4, and first and second sense terminals designated as High Sense and Low Sense in FIG. 4. The Force and Sense terminals are external terminals of the measurement apparatus 1000 for connection to a device-under-test (DUT) 90, and may, for example, be configured by coaxial cable connectors located at an outer housing of the measurement apparatus 1000. The connection to the DUT 90 may be a Kelvin connection.

In operation, the controller 10 outputs a first digital signal corresponding to a first current value to an input of the DAC11. The first current value may, for example, be indicative of a target current input to the DUT. The DAC 11 converts the first digital signal to a corresponding first analog signal, and the power amplifier 12 amplifies the first analog signal output by the DAC 11. The range resistance 13 is connected in series between an output of the power amplifier 12 and the High Force terminal. The first amplifier 14 amplifies a voltage across the range resistance 13. The first ADC 17 is configured to convert an output of the first amplifier 14 to a second digital signal, and to apply the second digital signal to the controller 10. The second digital signal may, for example, be indicative of a measured current input to the DUT.

The capacitor C1 together with first and second resistors R1 and R2 constitute an example of a low pass filter and protective circuit of the measurement apparatus 1000. In this illustrated example, the first resistor R1 is connected across the High Force terminal and the High Sense terminal, while the second resistor R2 has a first end connected to the first sense terminal. The first capacitor C1 is connected across the High Force terminal and a second end of the second resistor R2.

Each of the third and fourth resistors R3 and R4 have a first end connected to the Low Sense terminal. A second end of the fourth resistor R4 is connected to a reference voltage such as ground. A second end of the third resistor R3 is connected to an input of the second amplifier 15.

The second amplifier 15 amplifies a voltage across the second end of the second resistor R2 and the second end of the third transistor R3. The second ADC 18 is configured to convert an output of the second amplifier 15 to a third digital signal, and to apply the third digital signal to the controller 10. The third digital signal may, for example, be indicative of a measured voltage across the DUT.

The circuitry of FIG. 4 described thus far constitutes an example of a feedback loop that is operative in a current feedback mode and a voltage feedback mode under control of the controller 10. In the current feedback mode, the feedback loop is operative to sense a current flowing through the DUT 90 from the High Force terminal to the Low Force terminal based on outputs of the first amplifier 14 and first ADC 17. In the voltage feedback mode, the feedback loop is operative to sense a voltage across the DUT 90 (i.e., across the High Sense terminal and Low Sense terminal) based on outputs of the second amplifier 15 and second ADC 18.

In addition to the afore-described feedback loop, the measurement apparatus 1000 includes a measurement path for measuring a voltage and/or current across a pair of external terminals of the measurement apparatus 1000, and to supply the measured voltage and/or current to the controller 10. An example of the measurement path is described next.

Referring to FIG. 4, the measurement path of the illustrated example includes a third amplifier (Amp3) 16 configured to amplify a voltage across the High Sense terminal and the Low Sense terminal. That is, in the example of FIG. 4, one input of the third amplifier 16 is connected to a second end of a fifth resistor R5, while a first end of the resistor R5 is connected to the High Sense terminal. Another input of the third amplifier 16 is connected to the second end of the third resistor R3. The measurement path further includes a third analog-to-digital convertor (ADC3) 19 that converts an output of the third amplifier 16 to a digital signal that is applied to the controller 10.

The configuration of FIG. 4 allows for observation and optionally display by the measurement apparatus 1000 of transient voltage characteristics of the DUT, without the need of external equipment such as an oscilloscope. In particular, the third amplifier 16 of the measurement path bypasses the capacitor C1 with only the fifth resistor R5 in the measurement path from the High Sense terminal. As such, the measurement path has a greater bandwidth than the feedback path since it is not influenced by the capacitor C1 which has a time constant that is unsuitable for observing transient. Accordingly, the bandwidth of the signal applied to the third amplifier 16 is greater than the bandwidth of the signal applied to the second amplifier 15. That is, when the High Force terminal and the DUT 90 are connected by a cable and a transient current flows transiently from the high force terminal, the transient voltage observed by the second amplifier 15 and second ADC2 18 is filtered by the capacitor C1, second resistor R2 and impedance of the cable. (The first resistor R1 is usually a large resistance that does not impact measurements.) On the other hand, the measurement path including the fifth resistor R5 coupled to the High Sense terminal makes it possible to directly observe transient voltage characteristics of the DUT 90 using the measurement apparatus 1000. No external equipment is needed.

It is noted that the fifth resistor R5 is provided for circuit protection and to remove signal beyond the measurement band. However, in an alternative embodiment, the fifth resistor R5 may be omitted such that one input of the third amplifier 16 is directly connected to the High Sense terminal. Likewise, in another alternative embodiment, the other input of the third amplifier 16 (as well as an input to the second amplifier 15) directly connected to the Low Sense terminal by omitting the fourth resistor R4.

Other variations of the configuration of FIG. 4 fall within the scope of the inventive concepts. For example, the measurement apparatus 1000 of FIG. 4 operates based on digital feedback, and the controller 10 is a digital controller, an example of which is generally described in U.S. Pat. No. 5,579,236 to Tamamura et al., the disclosure of which is incorporated herein by reference in its entirety. However, in an alternative embodiment, the measurement apparatus 1000 operates based on analog feedback, and the controller 10 is implemented as an analog controller. In this case, the analog-to-digital and digital-to-analog conversion circuits of FIG. 4 would be omitted. An example of an analog controller is generally described in the Hewlett-Packard Journal, Volume 33, Number 10 (October 1982), the disclosure of which is incorporated herein by reference in its entirety.

Further, in alternative embodiments of inventive concepts, the measurement apparatus 1000 of FIG. 4 includes additional components, such as analog filters and the like, that are not shown in FIG. 4. Further, the measurement apparatus 1000 may include a display device for numerically and/or graphically displaying results of the various measurements carried out by the measurement apparatus 1000.

Figure 5:
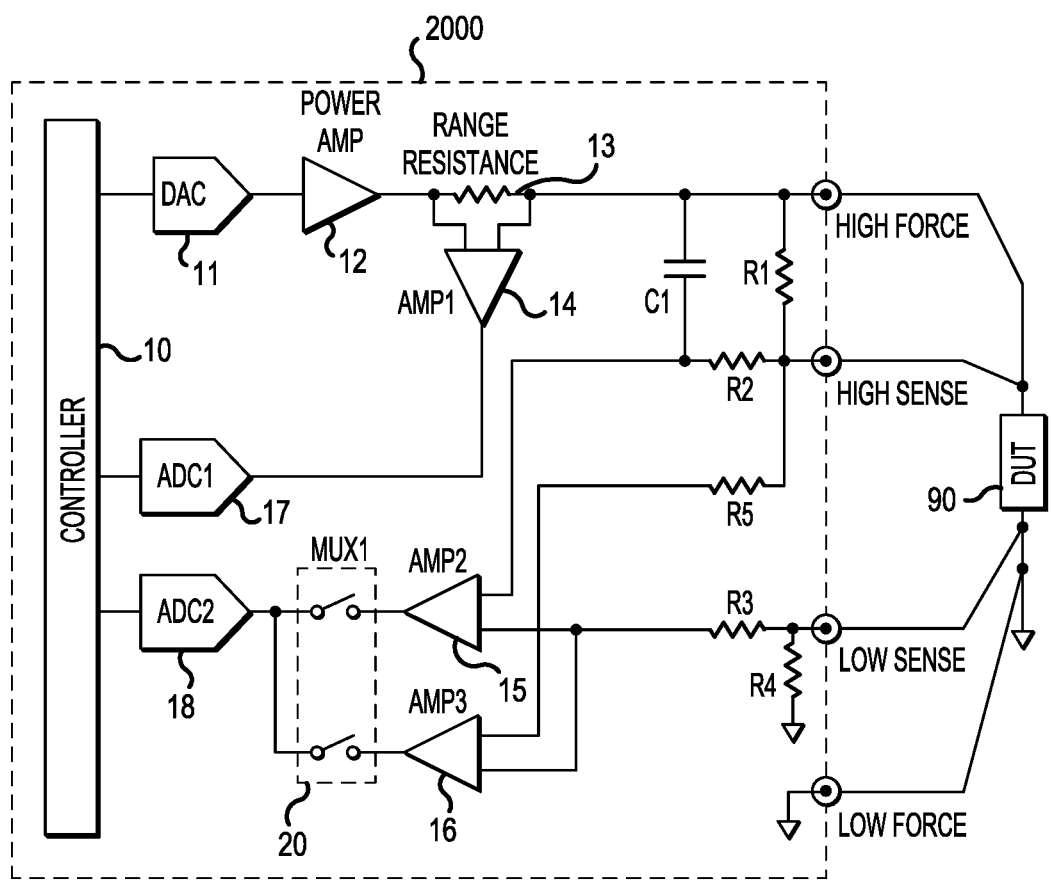
FIG. 5 is a circuit diagram of a measurement apparatus and DUT according to another embodiment of the inventive concepts.

FIG. 5 is a circuit diagram for reference in describing a measurement apparatus 2000 according to another embodiment of the inventive concepts. Elements of the measurement apparatus 2000 that are the same as or similar to those of the previous embodiment are designated with the same reference numbers as in the previous embodiment, and a detailed description of such elements is omitted here to avoid redundancy.

The embodiment of FIG. 5 differs from that of FIG. 4 in that one of the analog-to-digital convertors (ADC2 or ADC3) of FIG. 4 is omitted, and multiplexer switch (MUX1) 20 is added.

As shown in FIG. 5, the multiplexer switch 20 is operative to the alternately connect outputs of the second and third amplifiers 15 and 16 to the input of the second analog-to-digital converter 18. In this manner, the previously described feedback path and the measurement path may share the same analog-to-digital converter 18. This is achieved by sampling the outputs of the second and third amplifiers 15 and 16 using the multiplexer switch 20 to alternately feed the input of the second analog-to-digital converter 18. Otherwise, the embodiment of FIG. 5 operates in the same manner as that of FIG. 4.

Figure 6:
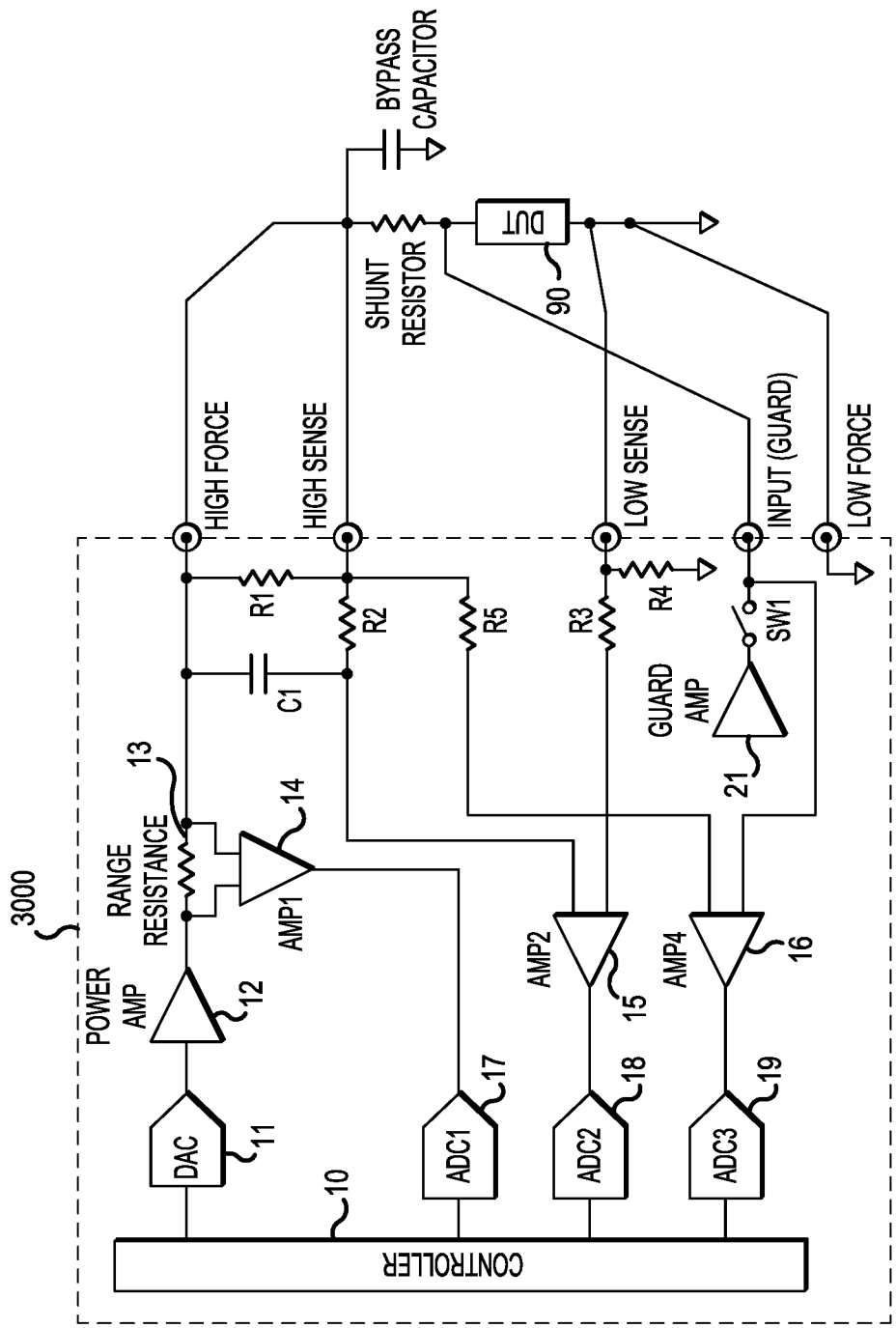
FIG. 6 is a circuit diagram of a measurement apparatus and DUT according to another embodiment of the inventive concepts.

FIG. 6 is a circuit diagram for reference in describing a measurement apparatus 3000 according to another embodiment of the inventive concepts. Elements of the measurement apparatus 2000 that are the same as or similar to those of the previous embodiment are designated with the same reference numbers as in the previous embodiments, and a detailed description of such elements is omitted here to avoid redundancy.

The embodiment of FIG. 6 differs from that of FIG. 4 in that an Input/Guard terminal is added and connected as an input to the third amplifier 16 (instead of the resistor R3 of the Low Sense terminal). The measurement apparatus 3000 of FIG. 6 also includes a guard amplifier connected to the Input/Guard terminal through a switch SW1.

The measurement path of the measurement apparatus 3000 is for observing transient voltage characteristics across a shunt resistor connected at the input of the DUT 90 in parallel with a bypass capacitor. When the switch SW1 is closed, the Input/Guard terminal is a guard output terminal. When the switch SW1 is open (as in FIG. 6), the Input/Guard terminal is a general purpose input terminal forming an input to the third amplifier 16 of the measurement path of the measurement apparatus 3000.

The configuration of FIG. 6 may be especially applicable when the measurement apparatus is used as a power source and the current consumed by the DUT 90 changes suddenly. That is, when the current consumed by the DUT 90 changes suddenly, the current is also supplied from the Bypass capacitor. However, by observing the voltage across the Shunt Resistor, the transient characteristics of the current consumed by the DUT 90 can be accurately observed. It is noted that the current supplied by the Bypass Capacitor can be modeled by finding the difference between the measurement results of the feedback path and the measurement path.

It is also noted that many modern source measurement apparatuses are equipped with a Guard output coupled to an internal guard amplifier. By adding the switch SW1 in the embodiment of FIG. 6, the same terminal can be utilized as a general purpose input terminal. This allows for observation of the voltage across the shunt resistor with supplying additional equipment. However, the inventive concepts associated with FIG. 6 are not limited to a dual-purpose terminal, and instead a separate input terminal can be added to observe the voltage across the shunt resistor.

Figure 7:
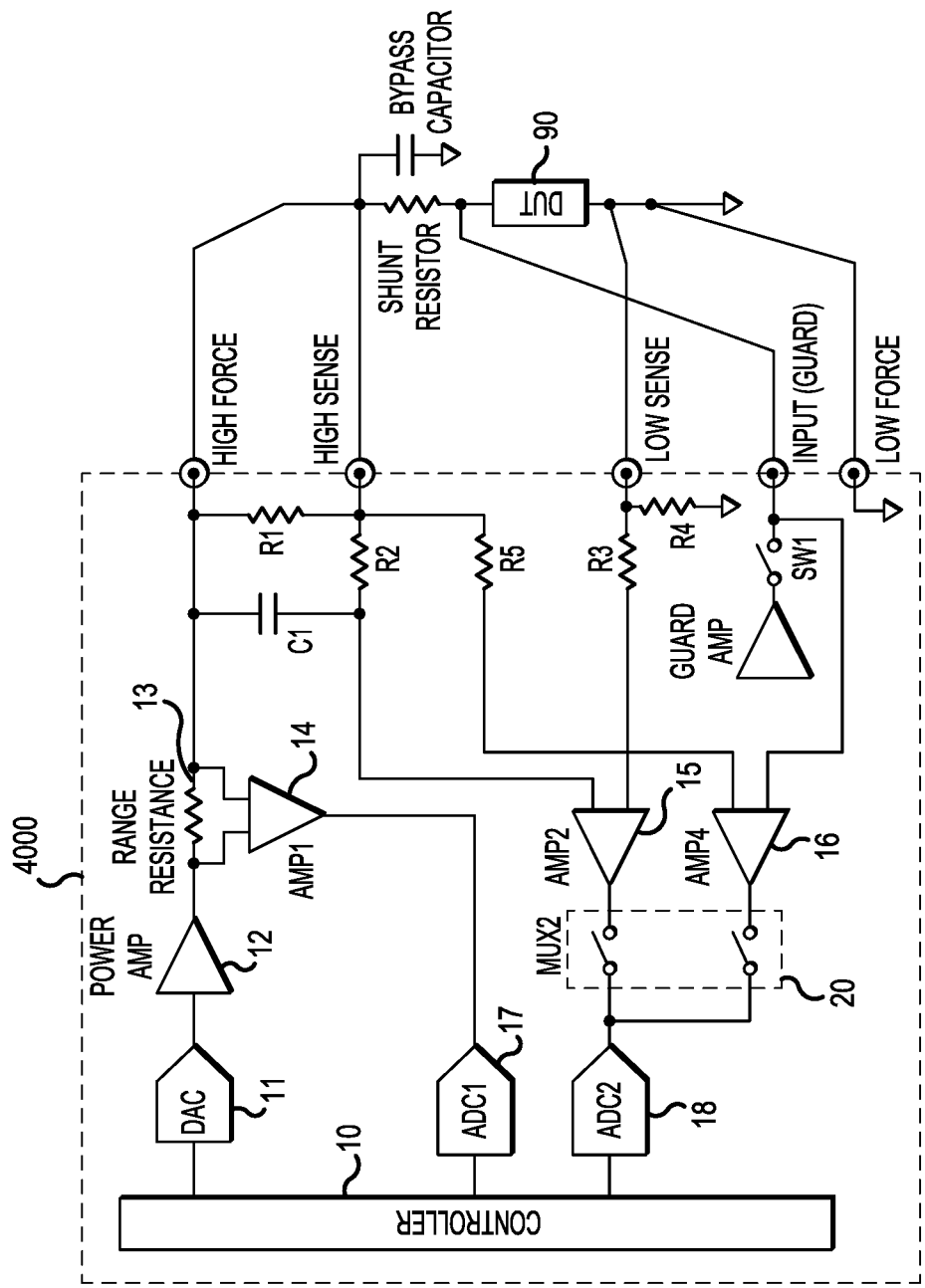
FIG. 7 is a circuit diagram of a measurement apparatus and DUT according to another embodiment of the inventive concepts.

FIG. 7 is a circuit diagram for reference in describing a measurement apparatus 4000 according to another embodiment of the inventive concepts. Elements of the measurement apparatus 4000 that are the same as or similar to those of the previous embodiment are designated with the same reference numbers as in the previous embodiment, and a detailed description of such elements is omitted here to avoid redundancy.

The embodiment of FIG. 7 differs from that of FIG. 6 in that one of the analog-to-digital convertors (ADC2 or ADC3) of FIG. 6 is omitted, and multiplexer switch (MUX1) 20 is added.

As shown in FIG. 7, the multiplexer switch 20 is operative to the alternately connect outputs of the second and third amplifiers 15 and 16 to the input of the second analog-to-digital converter 18. In this manner, the feedback path and the measurement path may share the same analog-to-digital converter 18. This may be achieved by sampling the outputs of the second and third amplifiers 15 and 16 using the multiplexer switch 20 to alternately apply the outputs of the second and third amplifiers 15 and 16 to the input of the second analog-to-digital converter 18. Otherwise, the embodiment of FIG. 7 operates in the same manner as that of FIG. 6.

Figure 8:
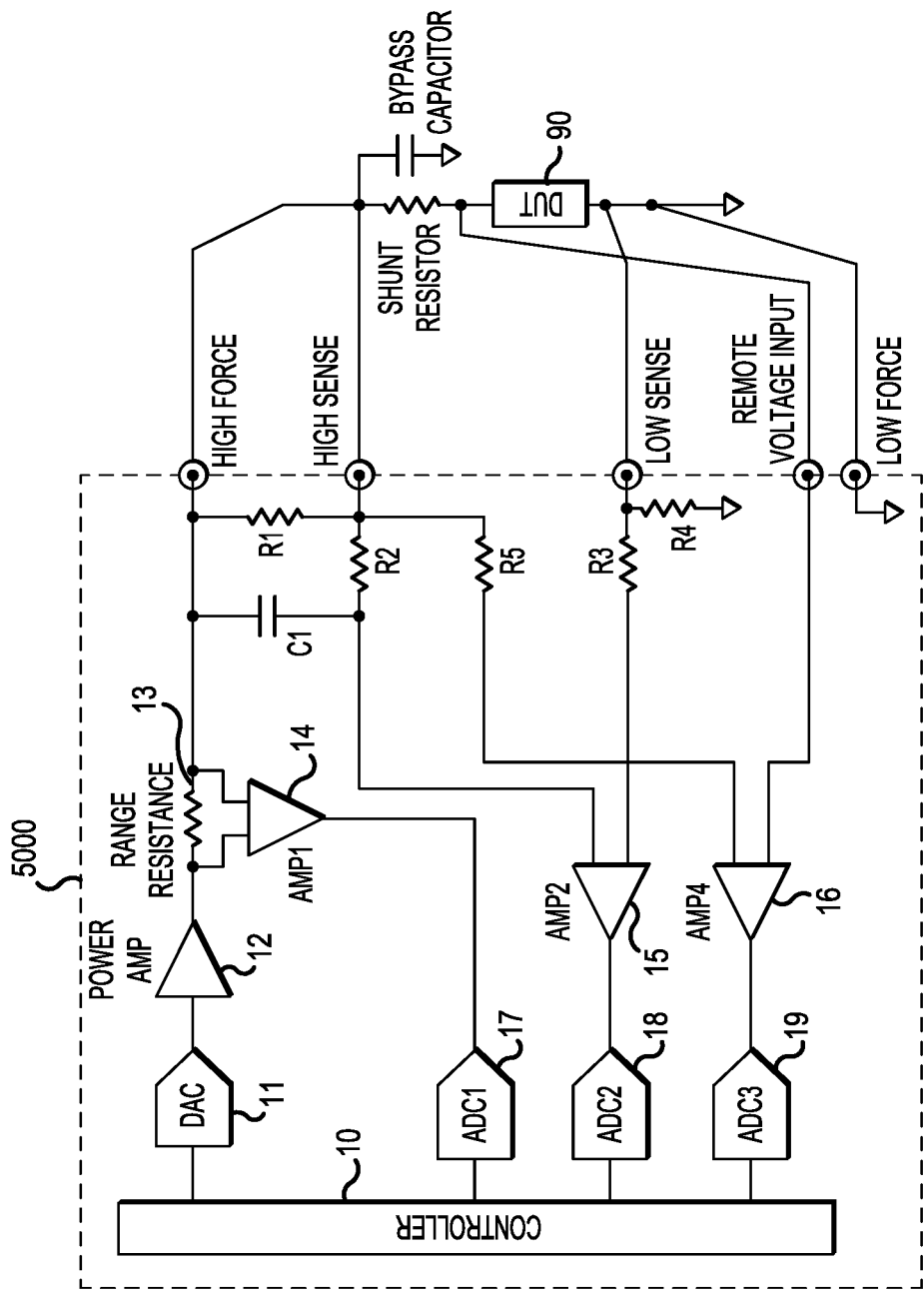
FIG. 8 is a circuit diagram of a measurement apparatus and DUT according to another embodiment of the inventive concepts.

FIG. 8 is a circuit diagram for reference in describing a measurement apparatus 5000 according to another embodiment of the inventive concepts. Elements of the measurement apparatus 5000 that are the same as or similar to those of the previous embodiment are designated with the same reference numbers as in the previous embodiment, and a detailed description of such elements is omitted here to avoid redundancy.

The embodiment of FIG. 8 differs from that of FIG. 6 in that the terminal used for connection to the shunt resistor is not implemented by sharing the guard terminal. Instead, a separate remote voltage input terminal is provided and connected as an input to the third amplifier 16, and used for connection to the shunt resistor coupled at the input of the DUT 90. Otherwise, the embodiment of FIG. 8 operates in the same manner as that of FIG. 6.

Figure 9:
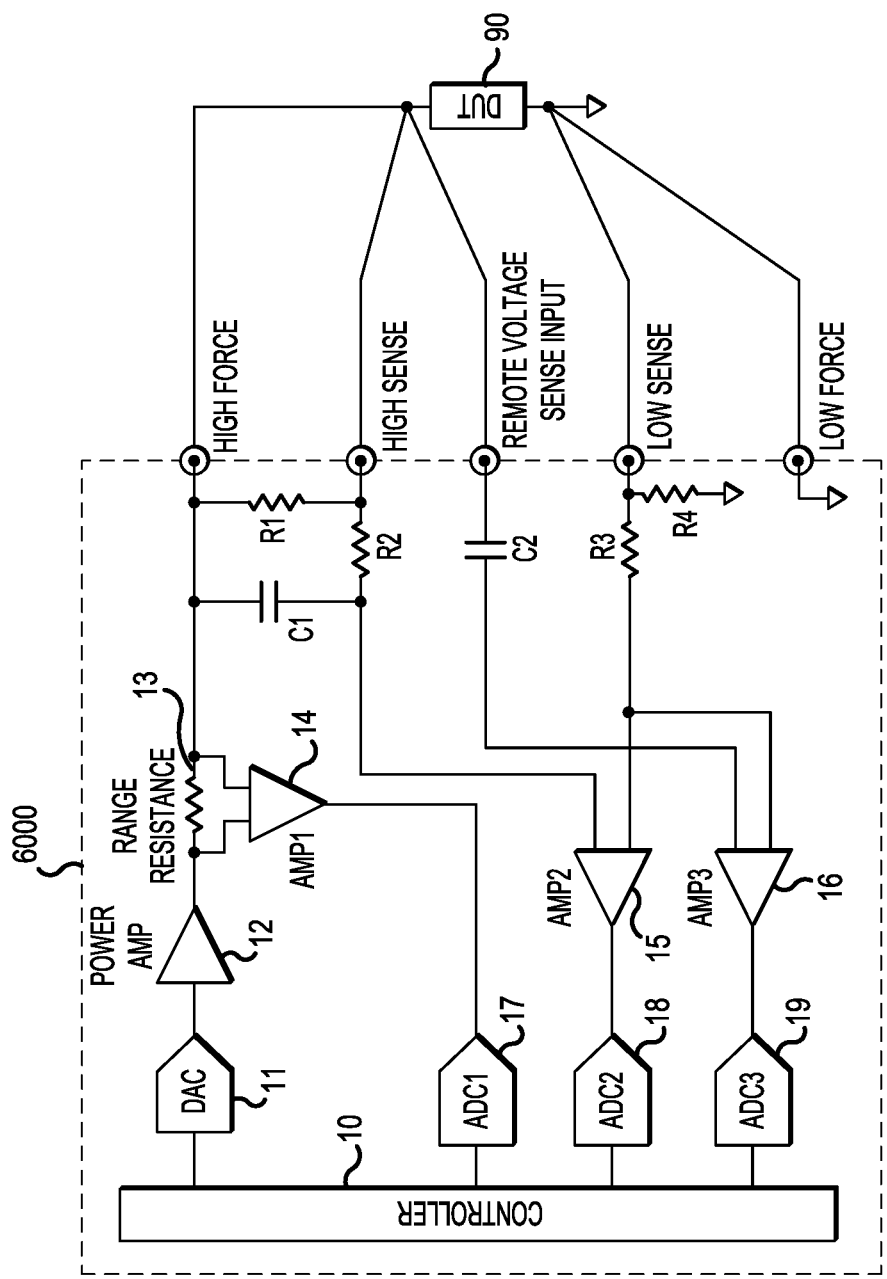
FIG. 9 is a circuit diagram of a measurement apparatus and DUT according to another embodiment of the inventive concepts.

FIG. 9 is a circuit diagram for reference in describing a measurement apparatus 6000 according to another embodiment of the inventive concepts. Elements of the measurement apparatus 6000 that are the same as or similar to those of the previous embodiment are designated with the same reference numbers as in the previous embodiment, and a detailed description of such elements is omitted here to avoid redundancy.

The embodiment of FIG. 9 differs from that of FIG. 4 in that a remote voltage input terminal is added, and one input of the third amplifier 16 is connected to the remote voltage input terminal through a second capacitor C2 (instead of being connected to the High Sense terminal through the resistor R5 as in FIG. 4).

The configuration of FIG. 9 is applicable to the measurement of an AC impedance of DUT. Here, the remote voltage input terminal is connected by cable to the input of the DUT, and the measurement path is form by the third amplifier 16 having one input connected to the remote voltage sense input terminal through the second capacitor C2, and another input connected to the Low Sense terminal through the third resistor R3. The second capacitor C2 functions to block a DC signal input to the third amplifier 16 so that AC signals only are input. In the meantime, voltage (Vforce) output at the High Force terminal includes a DC bias and a sine wave sweep. The measurement path of third amplifier 16 cuts out the DC component such that the AC voltage is observed. This allows for more accurate measurement of AC impedance when compared to the output of the second amplifier 15 which is impacted by the filter components of C1, R1 and R2.

Figure 10:
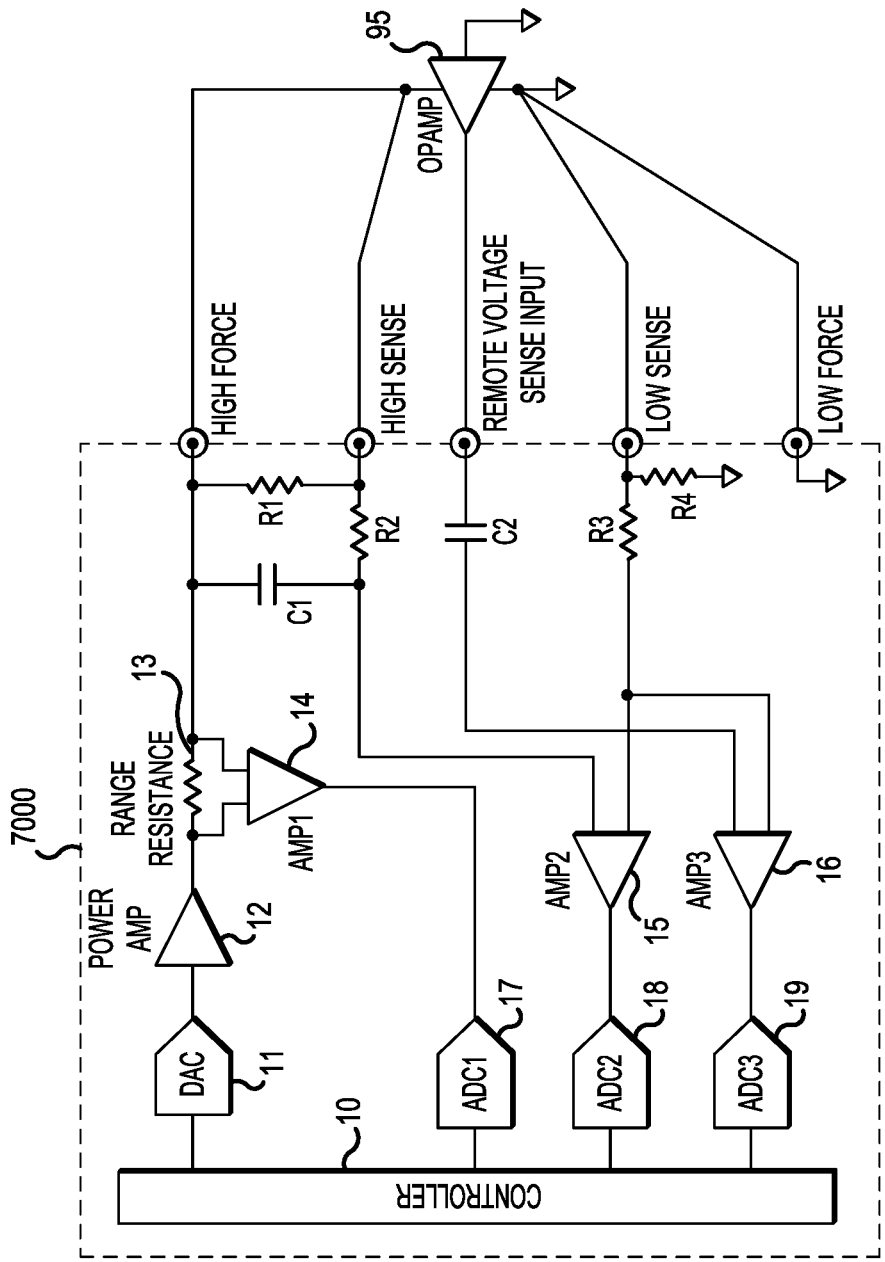
FIG. 10 is a circuit diagram of a measurement apparatus and operational amplifier according to another embodiment of the inventive concepts.

FIG. 10 is a circuit diagram for reference in describing a measurement apparatus 7000 according to another embodiment of the inventive concepts. Elements of the measurement apparatus 7000 that are the same as or similar to those of the previous embodiment are designated with the same reference numbers as in the previous embodiment, and a detailed description of such elements is omitted here to avoid redundancy.

The measurement apparatus 7000 of FIG. 10 is configured in the same manner as the measurement apparatus 6000 of FIG. 9. However, unlike the embodiment of FIG. 9, the embodiment of FIG. 10 is characterized by the DUT being an operational amplifier (Opamp) 95, and the measurement apparatus 7000 is connected as a power supply to the operational amplifier 95. Here, the High Force and High Sense terminals are connected to on supply terminal of the operational amplifier 95, and the Low Force and Low Sense terminals are connected to another supply terminal (e.g., ground) of the operational amplifier 95. An output of the operational amplifier 95 is connected to the remote voltage sense input.

The test set-up of FIG. 10 may be used to measure a Power Supply Rejection Ratio (PSRR) of the operational amplifiers. As in FIG. 9, the voltage (Vforce) output at the High Force terminal includes a DC bias and a sine wave sweep. The measurement path of third amplifier 16 cuts out the DC component such that the AC voltage is observed. By calculating the ratio between the voltage value obtained at the output of the third amplifier 16 and the magnitude of the AC voltage applied from the High Force terminal, the PSRR of the operational amplifier 95 is determined.

Figure 11:
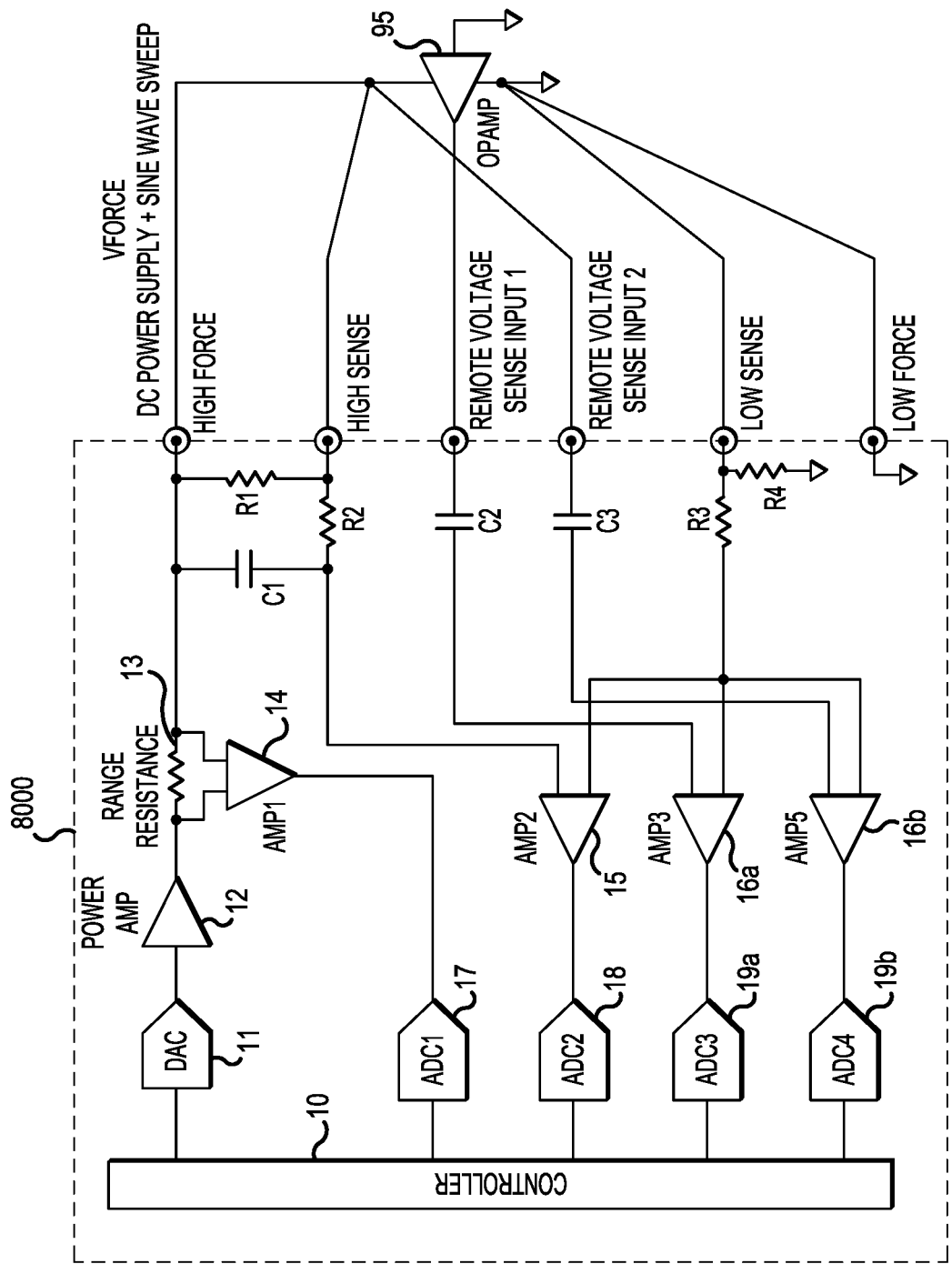
FIG. 11 is a circuit diagram of a measurement apparatus and operational amplifier according to another embodiment of the inventive concepts.

FIG. 11 is a circuit diagram for reference in describing a measurement apparatus 8000 according to another embodiment of the inventive concepts. Elements of the measurement apparatus 8000 that are the same as or similar to those of the previous embodiment are designated with the same reference numbers as in the previous embodiment, and a detailed description of such elements is omitted here to avoid redundancy.

The configuration of FIG. 11 essentially combines the measurement paths of FIGS. 9 and 10 into a single measurement apparatus 8000 to testing an operational amplifier 95 or other DUT. For this purpose, there are two remote voltage input terminals, second and third capacitors C2 and C3, and third and fourth amplifiers 16a and 16b as shown in FIG. 11. The measurement path including the third amplifier 16a may be used to observe the AC impedance of the operational amplifier 95 as described previously in connection with FIG. 9. The measurement path including the fourth amplifier 16b may be used to measure a PSRR of the operational amplifier 95 as described in connection with the embodiment of previously described FIG. 10.

Figure 12:
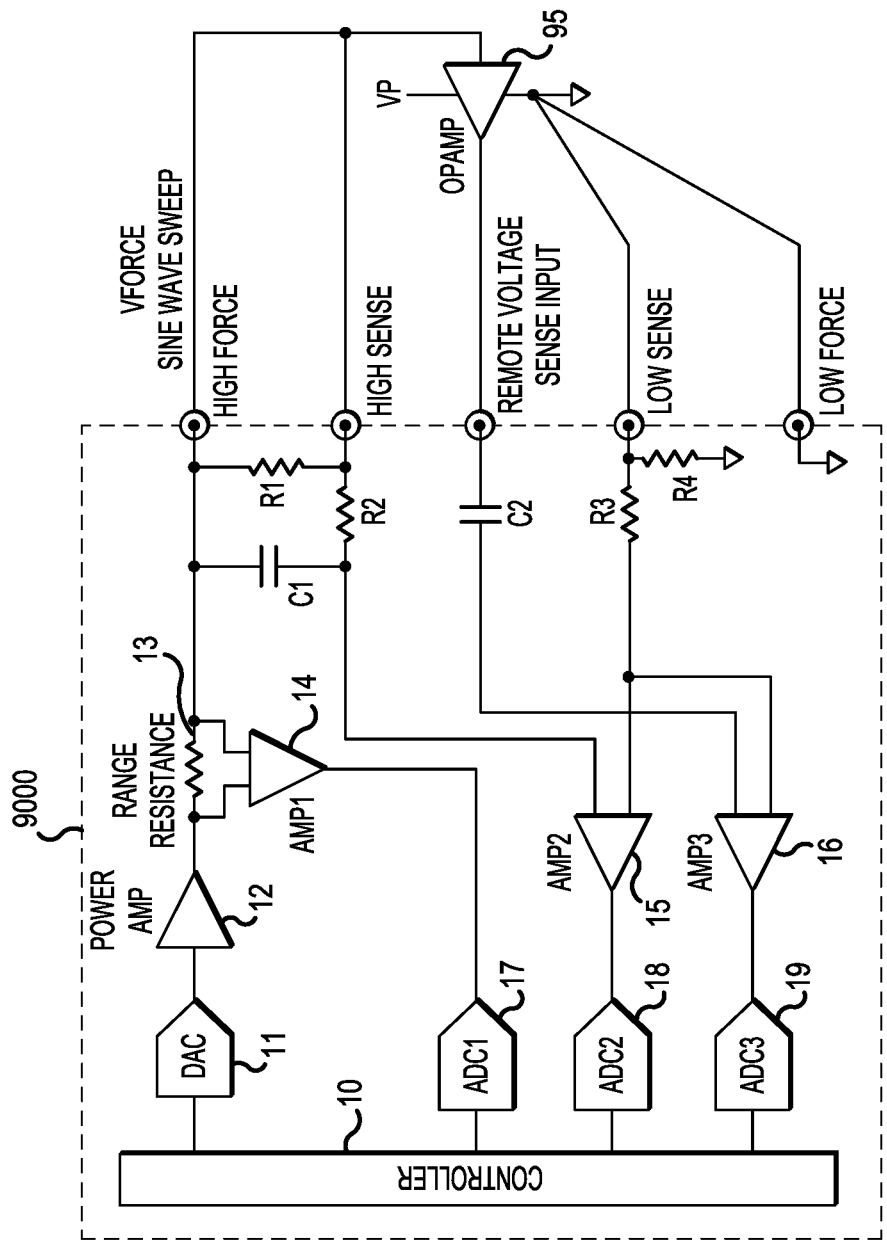
FIG. 12 is a circuit diagram of a measurement apparatus and operational amplifier according to another embodiment of the inventive concepts.

FIG. 12 is a circuit diagram for reference in describing a measurement apparatus 9000 according to another embodiment of the inventive concepts. Elements of the measurement apparatus 9000 that are the same as or similar to those of the previous embodiment are designated with the same reference numbers as in the previous embodiment, and a detailed description of such elements is omitted here to avoid redundancy.

The measurement apparatus 9000 of FIG. 12 is configured in the same manner as the measurement apparatus 7000 of FIG. 10. The test set-up shown in FIG. 12, however, may be used to measure a Common Mode Rejection Ratio (CMRR) of the operational amplifier 95 under test. In this case, a High Force voltage (Vforce) is applied as a sine wave sweep to the inverting and non-inverting of the operational amplifier 95, with the output of the operation amplifier 95 being connected to the remote voltage sense source. by adding a general-purpose voltage input terminal. The capacitor C2 blocks a DC signal component at the output of the operational amplifier 95 from being input to the third amplifier 16. The CMRR of the operational amplifier 95 may be determined by calculating a ratio between the voltage value obtained by the third amplifier 16 and a magnitude of the AC voltage applied from High Force terminal.

Figure 13:
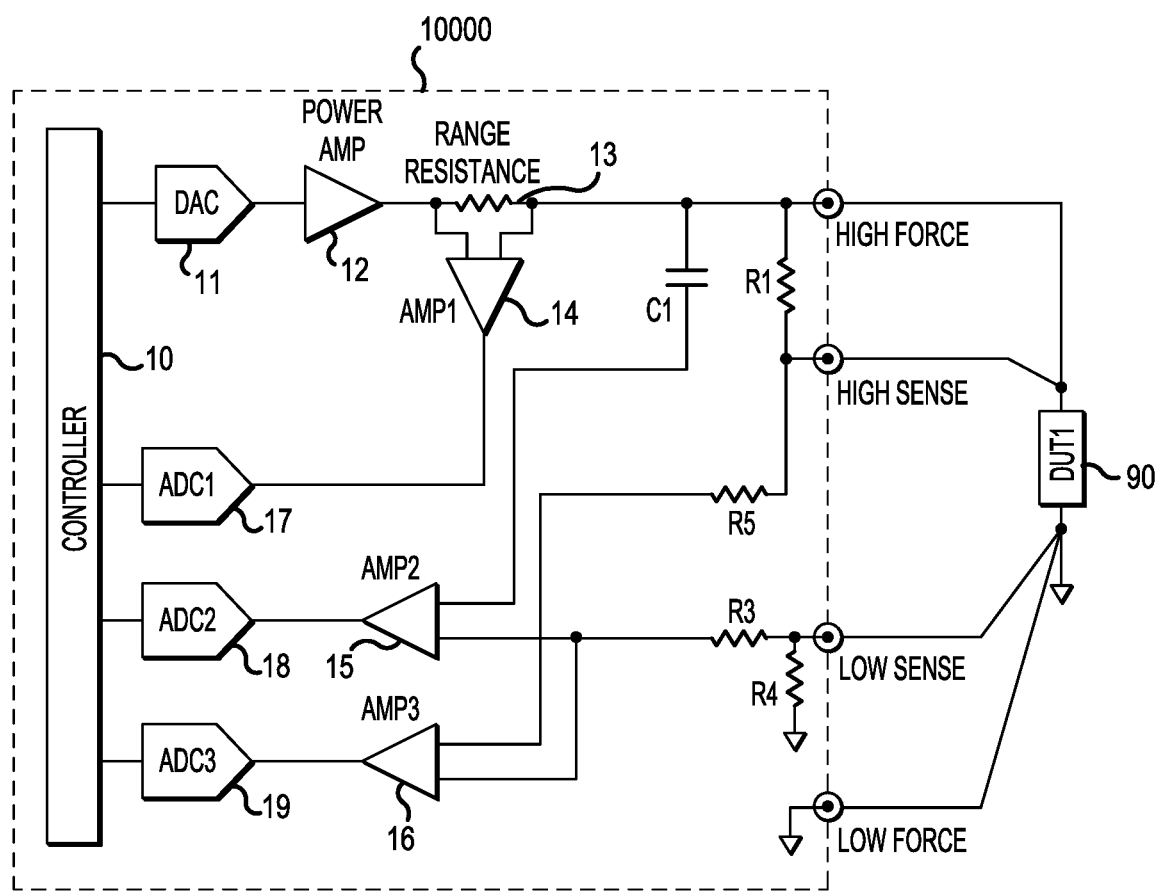
FIG. 13 is a circuit diagram of a measurement apparatus and DUT according to another embodiment of the inventive concepts.

FIG. 13 is a circuit diagram for reference in describing a measurement apparatus 10000 according to another embodiment of the inventive concepts. Elements of the measurement apparatus 10000 that are the same as or similar to those of the previous embodiment are designated with the same reference numbers as in the previous embodiment, and a detailed description of such elements is omitted here to avoid redundancy.

The configuration of the embodiment of FIG. 13 differs from that of FIG. 4 in that the capacitor C1 and the resistor R2 are omitted. This configuration enables wide-band voltage measurement from the DC region to high-speed response by the High Force terminal, which is not possible with the kelvin measurement of conventional equipment.

The feedback filter functionality of the omitted elements C1 and R2 may be executed digitally within the controller. A value obtained by adding a HPF (High Pass Filter) value of the difference between the second amplifier 15 and third amplifier 16 and the value of third amplifier 16 is the voltage value information. Herein, the value of first amplifier 14 is used as the information of the current value to construct the feedback for determining the DAC value.

Figure 14:
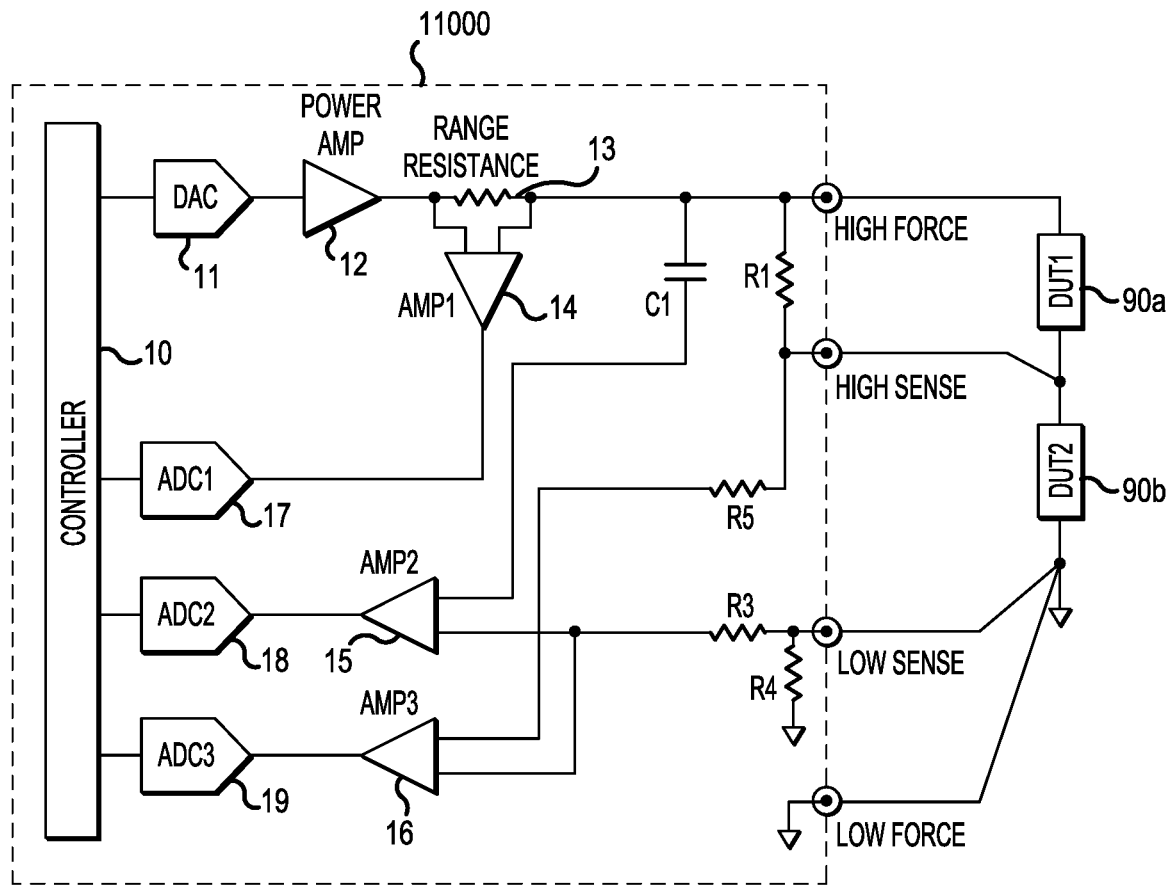
FIG. 14 is a circuit diagram of a measurement apparatus and DUT according to another embodiment of the inventive concepts.

FIG. 14 is a circuit diagram for reference in describing a measurement apparatus 11000 according to another embodiment of the inventive concepts. Elements of the measurement apparatus 11000 that are the same as or similar to those of the previous embodiment are designated with the same reference numbers as in the previous embodiment, and a detailed description of such elements is omitted here to avoid redundancy.

The configuration of the measurement apparatus 11000 of FIG. 14 is the same as the configuration of the measurement apparatus 10000 of FIG. 13. In FIG. 14, however, the test set-up includes a first DUT1 90a connected between the High Force and High Sense terminals, and a second DUT2 90b connected between the High Sense and Low Sense terminals. Here, the second operational amplifier 15 measures the potential difference between the High Force and Low Sense terminals. The third operational amplifier 16 measures the potential difference between the High Sense and Low Sense terminals. By referencing the current value measured by the first amplifier 14, it is possible to measure the impedance of multiple DUTs at the same time.

While the invention has been illustrated and described in detail in the drawings and foregoing description, such illustration and description are to be considered illustrative or exemplary and not restrictive; the invention is not limited to the disclosed embodiments.

Aspects of the present invention may be embodied as an apparatus, method or computer program product. Accordingly, aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

While representative embodiments are disclosed herein, one of ordinary skill in the art appreciates that many variations that are in accordance with the present teachings are possible and remain within the scope of the appended claim set. The invention therefore is no to be restricted except within the scope of the appended claims.

What is claimed is:

1. A measurement apparatus comprising:
    external terminals configured for connection to a device-under-test (DUT), the external terminals including first and second force terminals and first and second sense terminals;
    a controller;
    a feedback loop configured in a current feedback mode to sense a current flowing from the first force terminal to the second force terminal, and in a voltage feedback mode to sense a voltage across the first and second sense terminals; and
    a measurement path configured to measure a least one of a voltage and current across a pair of the external terminals and to supply the measured at least one of the voltage and current to the controller, wherein a bypass capacitor is not provided at an input of the DUT.

2. The measurement apparatus of claim 1, wherein a bandwidth of the feedback loop is lower than a bandwidth of the measurement path.

3. The measurement apparatus of claim 2, wherein the feedback loop includes a first analog-to-digital convertor (ADC) operative in the current feedback mode and having an output connected to the controller, and a second ADC operative in the voltage feedback mode and having an output connected to the controller.

4. The measurement apparatus of claim 3, wherein the pair of the external terminals is the first and second sense terminals.

5. The measurement apparatus of claim 4, wherein the measurement path includes a third ADC having an output connected to the controller.

6. The measurement apparatus of claim 5, further comprising a multiplexer having inputs connected in the feedback loop and measurement path, and an output connected to the second ADC.

7. The measurement apparatus of claim 6, wherein the external terminals further include an input terminal, and
    wherein the pair of the external terminals is the input terminal and one of the first and second sense terminals.

8. The measurement apparatus of claim 7, wherein the input terminal is a guard terminal connected through a switching element to a guard amplifier.

9. The measurement apparatus of claim 8, wherein the measurement path includes a third ADC having an output connected to the controller.

10. The measurement apparatus of claim 8, further comprising a multiplexer having inputs connected in the feedback loop and the measurement path, and an output connected to the second ADC.

11. The measurement apparatus of claim 7, wherein the input terminal is a remote voltage input terminal.

12. The measurement apparatus of claim 11, wherein a second pair of external terminals is the first sense terminal and the remote voltage input terminal.

13. The measurement apparatus of claim 11, wherein a second pair of external terminals is the second sense terminal and the remote voltage input terminal.

14. The measurement apparatus of claim 11, further comprising a capacitive element connected to the remote voltage input terminal in the measurement path.

15. The measurement apparatus of claim 2, further comprising:
a second measurement path configured to measure at least one of a voltage and a current across a second pair of the external terminals which is different from a first pair of external terminals.

16. The measurement apparatus of claim 1, wherein the external terminals are each configured for connection to a coaxial cable.

17. A measurement apparatus comprising:
first and second force terminals;
first and second sense terminals;
a controller configured to output a first digital signal corresponding to a first current value;
a digital-to-analog converter configured to convert the first digital signal to a first analog signal;
a power amplifier configured to amplify the first analog signal;
a range resistor connected in series between an output of the power amplifier and the first force terminal;
a first amplifier configured to amplify a voltage across the range resistor;
a first analog-to-digital converter (ADC) configured to convert an output of the first amplifier to a second digital signal, and apply the second digital signal to the controller;
a first resistor connected across the first force terminal and the first sense terminal;
a second resistor having a first end connected to the first sense terminal;
a first capacitor connected across the first force terminal and a second end of the second resistor;
a second amplifier configured to amplify a voltage across the second end of the second resistor and the second sense terminal;
a third amplifier configured to amplify a voltage across the first sense terminal and the second sense terminal; and
at least one second ADC configured to converts outputs of the second and third amplifiers to respective third and fourth digital signals, and to apply the third and fourth digital signals to the controller.

18. The measurement apparatus of claim 17, wherein the at least one second ADC includes:
a second ADC configured to convert the output of the second amplifier to the third digital signal, and to apply the third digital signal to the controller; and
a third ACD configured to convert the output of the third amplifier to the fourth digital signal, and to apply the fourth digital signal to the controller.

19. The measurement apparatus of claim 17, further comprising a multiplexer having inputs respectively connected to the outputs of the second and third amplifiers,
wherein the at least one second ADC includes a second ADC configured to convert an output of the multiplexer to the third and fourth digital signals, and to apply the third and fourth digital signals to the controller.

20. A measurement apparatus comprising:
first and second force terminals;
first and second sense terminals;
an input terminal;
a controller configured to output a first digital signal corresponding to a first current value;
a digital-to-analog converter configured to convert the first digital signal to a first analog signal;
a power amplifier configured to amplify the first analog signal;
a range resistor connected in series between an output of the power amplifier and the first force terminal;
a first amplifier configured to amplify a voltage across a first resistor;
a first analog-to-digital converter (ADC) configured to convert an output of the first amplifier to a second digital signal, and apply the second digital signal to the controller;
a first resistor connected across the first force terminal and the first sense terminal;
a second resistor having a first end connected to the first sense terminal;
a first capacitor connected across the first force terminal and a second end of the second resistor;
a second amplifier configured to amplify a voltage across the second end of the second resistor and the second sense terminal;
a third amplifier configured to amplify a voltage across the second sense terminal and the input terminal; and
at least one second ADC configured to converts outputs of the second and third amplifiers to respective third and fourth digital signals, and to apply the third and fourth digital signals to the controller.

21. The measurement apparatus of claim 20, wherein the input terminal is shared with a guard terminal of the measurement apparatus.

22. The measurement apparatus of claim 20, wherein the input terminal is a remote voltage input.

23. The measurement apparatus of claim 20, wherein a bandwidth of a signal applied to second amplifier is lower than a bandwidth of a signal applied to the third amplifier.

24. A measurement apparatus comprising:
first and second force terminals;
first and second sense terminals;
a remote voltage input terminal;
a controller configured to output a first digital signal corresponding to a first current value;

a digital-to-analog converter configured to convert the first digital signal to a first analog signal;

a power amplifier configured to amplify the first analog signal;

a range resistor connected in series between an output of the power amplifier and the first force terminal;

a first amplifier configured to amplify a voltage across a first resistor;

a first analog to digital converter configured to convert an output of the first amplifier to a second digital signal, and apply the second digital signal to the controller;

a first resistor connected across the first force terminal and the first sense terminal;

a second resistor having a first end connected to the first sense terminal;

a first capacitor connected across the first force terminal and a second end of the second resistor;

a second capacitor having a first end connected to the remote voltage input terminal;

a second amplifier configured to amplify a voltage across the first sense terminal and the second sense terminal;

a third amplifier configured to amplify a voltage across a second end of the second capacitor and the first sense terminal; and at least one second ADC configured to converts outputs of the second and third amplifiers to respective third and fourth digital signals, and to apply the third and fourth digital signals to the controller.

25. The measurement apparatus of claim 24, wherein a bandwidth of a signal applied to second amplifier is lower than a bandwidth of a signal applied to the third amplifier.

26. A measurement apparatus comprising:
first and second force terminals;
first and second sense terminals;
a remote voltage input terminal;
a controller configured to output a first digital signal corresponding to a first current value;
a digital-to-analog converter configured to convert the first digital signal to a first analog signal;
a power amplifier configured to amplify the first analog signal;
a range resistor connected in series between an output of the power amplifier and the first force terminal;
a first amplifier configured to amplify a voltage across a first resistor;
a first analog-to-digital converter (ADC) configured to convert an output of the first amplifier to a second digital signal, and apply the second digital signal to the controller;
a first resistor connected across the first force terminal and the first sense terminal;
a second resistor having a first end connected to the first sense terminal;
a second amplifier configured to amplify a voltage across the first force terminal and the second sense terminal;
a third amplifier configured to amplify a voltage across a second end of the second resistor and the second sense terminal; and
at least one second ADC configured to converts outputs of the second and third amplifiers to respective third and fourth digital signals, and to apply the third and fourth digital signals to the controller.

27. The measurement apparatus of claim 26, wherein a bandwidth of a signal applied to second amplifier is lower than a bandwidth of a signal applied to the third amplifier.

* * * * *